United States Patent
Okada (10) Patent No.: US 8,853,640 B2
(45) Date of Patent: Oct. 7, 2014

(54) RADIATION DETECTING ELEMENT, RADIOGRAPHIC IMAGE DETECTING PANEL, AND RADIOGRAPHIC IMAGE DETECTING DEVICE

(71) Applicant: FUJIFILM Corporation, Tokyo (JP)

(72) Inventor: Yoshihiro Okada, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/173,832

(22) Filed: Feb. 6, 2014

(65) Prior Publication Data

US 2014/0138552 A1  May 22, 2014

Related U.S. Application Data

(63) Continuation of application No. PCT/JP2012/068722, filed on Jul. 24, 2012.

(30) Foreign Application Priority Data

Aug. 12, 2011 (JP) .................. 2011-177327

(51) Int. Cl.
*G01T 1/24* (2006.01)
*H01L 27/146* (2006.01)

(52) U.S. Cl.
CPC .......... *G01T 1/247* (2013.01); *H01L 27/14658* (2013.01); *H01L 27/14632* (2013.01)
USPC ..................... 250/370.09; 250/394

(58) Field of Classification Search
CPC .................. G01T 1/16; G01T 1/247
USPC ........................... 250/394, 370.09
See application file for complete search history.

(56) References Cited

U.S. PATENT DOCUMENTS 5,576,857 A * 11/1996 Takemura ..................... 349/42
5,847,684 A * 12/1998 Strik ............................. 345/58

(Continued)

FOREIGN PATENT DOCUMENTS

| JP | 2000-105278 A | 4/2000 |
| JP | 2003-255049 A | 9/2003 |
| JP | 2011-109012 A | 6/2011 |
| JP | 2011-146587 A | 7/2011 |

OTHER PUBLICATIONS

Written Opinion of the ISA issued in International Application No. PCT/JP2012/068722 on Aug. 21, 2012.

(Continued)

*Primary Examiner* — David Porta
*Assistant Examiner* — Djura Malevic
(74) *Attorney, Agent, or Firm* — SOLARIS Intellectual Property Group, PLLC (57) ABSTRACT

The present invention provides a radiation detecting element that avoids the interline pitch of signal lines becoming narrower. Namely, the shape of pixels configuring the radiation detecting element is made hexagonal, and each of the pixels is arrayed in a honeycomb pattern. The position of the TFT switches in each of the pixels is disposed to the right side or the left side of the center of the pixels so as to be left-right direction different for each of the pixel rows, and common ground lines that fix storage capacitor lower electrodes of charge storage capacitors are configured laid out in substantially straight lines lower than pixel electrodes.

16 Claims, 8 Drawing Sheets

(56) References Cited

U.S. PATENT DOCUMENTS

| | | | |
|---|---|---|---|
| 6,933,998 B1* | 8/2005 | Iwahashi | 349/143 |
| 2008/0210946 A1* | 9/2008 | Okada et al. | 257/71 |
| 2011/0032241 A1* | 2/2011 | Jeong et al. | 345/212 |
| 2011/0121189 A1 | 5/2011 | Okada | |
| 2011/0174957 A1 | 7/2011 | Okada | |
| 2012/0127148 A1* | 5/2012 | Lee et al. | 345/212 |

OTHER PUBLICATIONS

International Search Report issued in International Application No. PCT/JP2012/068722 on Aug. 21, 2012.

* cited by examiner

RADIATION DETECTING ELEMENT, RADIOGRAPHIC IMAGE DETECTING PANEL, AND RADIOGRAPHIC IMAGE DETECTING DEVICE

CROSS-REFERENCE TO RELATED APPLICATIONS

This application is a continuation application of International Application No. PCT/JP2012/068722, filed on Jul. 24, 2012, which is incorporated herein by reference, in its entirety. Further, this application claims priority from Japanese Patent Application No. 2011-177327, filed on Aug. 12, 2011, which is incorporated herein by reference, in its entirety.

BACKGROUND OF THE INVENTION

1. Field of the Invention

The present invention relates to a radiation detecting element, a radiographic image detecting panel and a radiographic image detecting apparatus. The present invention particularly relates to a radiation detecting element, a radiographic image detecting panel and a radiographic image detecting apparatus that directly convert radiation into charges.

2. Description of the Related Art

Recently, in most radiographic image detecting apparatuses, a FPD (flat panel detector) that has an X-ray sensitive layer disposed on a TFT (Thin Film Transistor) active matrix substrate and is capable of directly converting X-ray information into digital data, is employed as a radiation detecting element. Making a smaller pixel size is effective in raising the resolution of a FPD. Particularly, in a direct-conversion-type radiation detecting element that employs selenium (Se) in a photoelectric conversion layer for absorbing radiation and converting into charges, the pixel size contributes to raising the resolution. Accordingly, there have recently been attempts to raise the quality by high miniaturization of the pixel size.

However, in a FPD, the charge amount capable of being collected reduces in proportion to the reduction in pixel size, and as a result the sensitivity (S/N) is lowered, such that sometimes even though the resolution is raised, overall quality DQE actually drops. Accordingly, there is a proposal that attempts to achieve a higher light utilization ratio whilst raising resolution and maintaining S/N by arraying pixels with a hexagonal shaped profile in a honeycomb pattern (see for example Japanese Patent Application Laid-Open (JP-A) No. 2003-255049 and JP-A No. 2000-105278).

Figure 7:
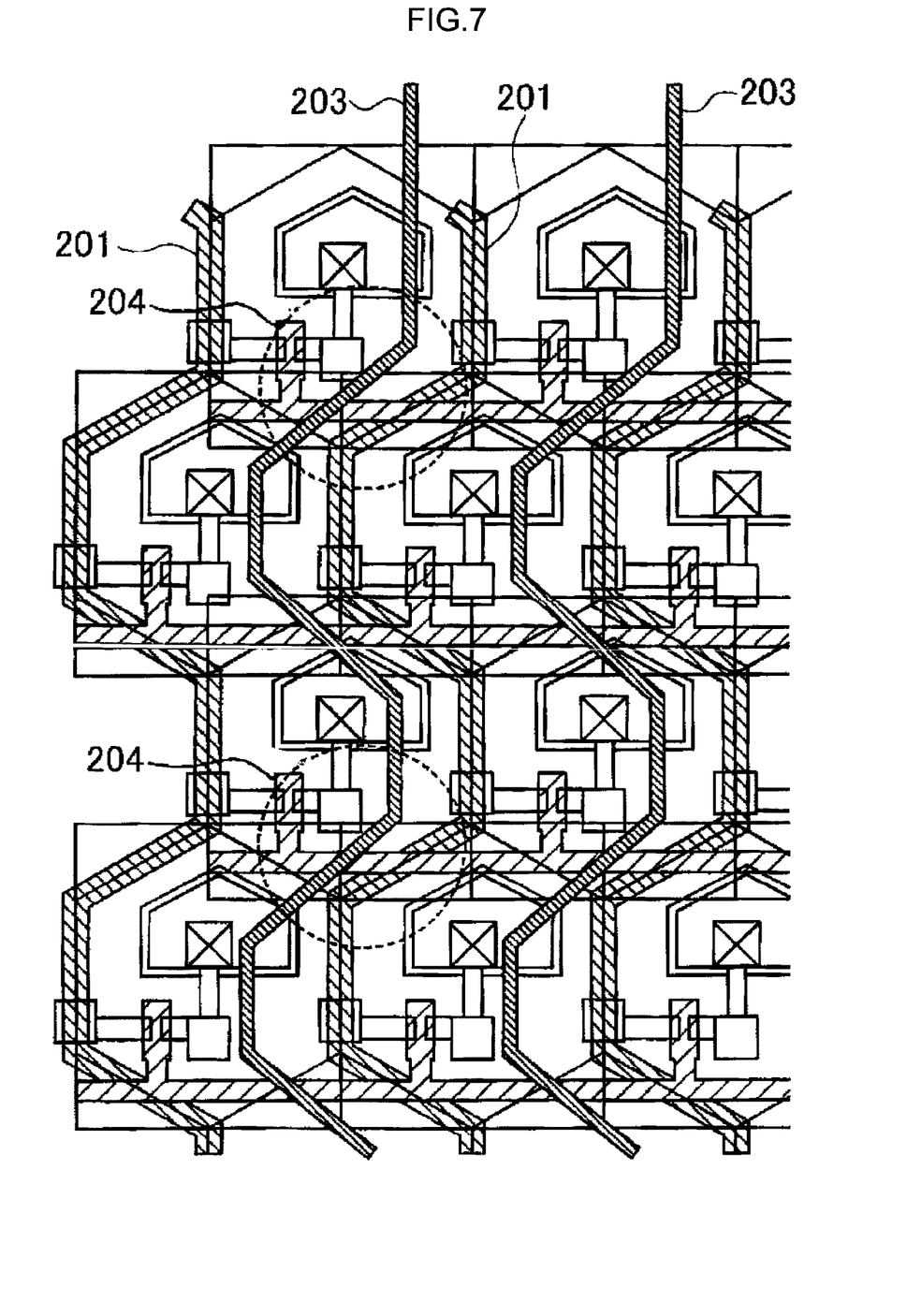
FIG. 7 is a plan view illustrating signal lines in a radiation detecting section in a conventional radiation detecting element.

An apparatus described in JP-A No. 2003-255049 is an indirect-conversion-type radiation detecting apparatus that is not equipped with capacitors (auxiliary capacitors) to accumulate charges obtained by photoelectric conversion. Common ground lines such as those in a direct-conversion-type radiographic image detecting apparatus are accordingly not required. Thus bias lines 103 illustrated in FIG. 9 of JP-A No. 2003-255049 are wiring in an upper portion of the photoelectric conversion section, and design degrees of freedom are secured for the bias lines. However, the auxiliary capacitors mentioned above are required for direct-conversion-type radiographic image detecting apparatuses, and so bias lines need to be placed. In a radiation detecting section of a direct-conversion-type radiographic image detecting apparatus, a case is illustrated in FIG. 7 in which hexagonal shaped pixels are arrayed in a honeycomb pattern and the position of TFT switches 204 within the pixels is, similarly to in cases of rectangular pixel shape, placed so as to face in the same direction for all the pixels, with common ground lines 203 snaking to match the data lines 201 so that the data lines 201 do not intersect with the common ground lines 203. In such cases, locations arise where the distance to the TFT switches becomes narrower, at portions where the common ground lines 203 snake to the left or right (see the portions encircled in intermittent lines in FIG. 7. In FIG. 7 the distance to the TFT switches gets nearer at the portions where snaking to the left). Moreover, due to the distance between the TFT switches and the data lines becoming narrow, the common ground lines 203 touch the TFT switches, making it difficult to layout the common ground lines. Moreover, the resistance of the lines rises in cases in which there are narrower common ground lines 203, making it difficult to maintain the common voltage (ground).

Moreover, in cases in which the data lines 201 and the common ground lines 203 approach each other, the capacitance between the data lines and the common ground lines increases. This is consequently a significant impediment to high degrees of miniaturization of pixels of a radiation detecting element, and means that the resolution of the radiation detecting element cannot be raised.

The present invention provides a radiation detecting element, a radiographic image detecting panel and a radiographic image detecting apparatus that achieve greater miniaturization whilst avoiding the interline pitch of signal lines becoming narrower.

SUMMARY OF THE INVENTION

A first aspect of the present invention is a radiation detecting element including: a sensor section configured from plural hexagonal shaped pixels, each of which includes a semiconductor film that receives irradiated radiation and generates charges, that are arrayed adjacent to each other in a two dimensional pattern; a detecting section, provided for each of the pixels, including a pixel electrode that collects the charges, a storage capacitor that accumulates charges that have been collected by the pixel electrode, and a switching element that reads the charges accumulated in the storage capacitor; plural scan lines that are disposed parallel to each other and that transmit signals for performing switching control of the switching elements; plural data lines that are disposed so as to intersect with the scan lines and so as to bend along a portion of a peripheral edge of the hexagonal shaped pixels, and that transmit electrical signals corresponding to the charges read by the switching elements; and plural common lines that connect together one electrode of the storage capacitors and fix the storage capacitor electrodes at a specific potential, wherein the switching elements are placed within regions surrounded by a line segment that divides the pixels in two in a direction intersecting with the extension direction of the plurality of scan lines and 3 continuous data-line-provided sides out of peripheral edges of the pixels, and are connected to the 3-continuous-side-provided data lines, and the common lines are disposed between the plurality of data lines so as not to intersect with the data lines.

A second aspect of the present invention, in the above first aspect, the common lines may extend in a straight line shape or a substantially straight line shape between the plurality of data lines. Further, a third aspect of the present invention, in the above aspects, the plural common lines may be connected to the plural data lines via the storage capacitors and the switching elements. Furthermore, a fourth aspect of the present invention, in the above third aspect, the storage capacitors and the switching elements may be placed alternately on one side or the other side of the data lines every pixel row delimited by the plural scan lines.

A fifth aspect of the present invention, in the above aspects, the plural common lines may be disposed at a lower layer side with respect to the pixel electrodes. A sixth aspect of the present invention, in the above first to fourth aspects, the plural scan lines, the plural data lines, the plural common lines, and the switching elements may be disposed at a lower layer side of the sensor section.

A seventh aspect of the present invention, in the above aspect, the plural data lines may be formed in a different metal layer from the metal layer in which the plural scan lines are formed, with an insulating film interposed therebetween. Further, an eighth aspect of the present invention, in the above aspects a gate electrode of the switching element may be connected to the scan lines, one out of the drain electrode or the source electrode is connected to one electrode of the storage capacitor, and the other out of the drain electrode or the source electrode is connected to the data line.

A ninth aspect of the present invention, in the above aspects, the pixel electrodes may be disposed so as not to overlap in the cross-sectional direction with the data lines.

A tenth aspect of the present invention, in the above ninth aspect, the pixel electrodes may be disposed so as to overlap in the cross-sectional direction with the common lines.

An eleventh aspect of the present invention, in the ninth aspect, the pixel electrodes may be disposed so as to overlap in the cross-sectional direction with the storage capacitors.

A twelfth aspect of the present invention, in the above aspects, the shape of the pixel electrodes may be substantially equivalent to the shape of the hexagonal shaped pixels, and may be a substantially hexagonal shape having corners beveled and a surface area smaller than the surface area of the pixels.

A thirteenth aspect of the present invention, in the above aspects, the shape of the pixel electrodes may be a circular shape having a surface area smaller than the surface area of the pixels.

A fourteenth aspect of the present invention is a radiographic image detecting apparatus including: a radiation detecting element of the above aspects; a scan signal control section that outputs, to the plural scan lines, signals for performing switching control of the switching elements; and a signal processing section that detects the electrical signals transmitted through the plural data lines, that subjects the detected electrical signals to specific processing, and that generates digital image data, wherein the signal processing section converts image data obtained from the plural hexagonal shaped pixels into image data representing an image of plural substantially square shaped pixels arrayed in a square grid and generates the digital image data.

A fifteenth aspect of the present invention is a radiographic image detecting panel including a radiation detecting element that includes a sensor section configured from plural hexagonal shaped pixels that each include a semiconductor film that receives irradiated radiation and generates charges arrayed adjacent to each other in a two dimensional pattern, wherein plural data lines are disposed so as to bend along a peripheral edge of the hexagonal shaped pixels, and switching elements that read charges accumulated in storage capacitors are placed within regions surrounded by a line segment that divides the pixels in two in a direction intersecting with the extension direction of the plural scan lines and 3 continuous data-line-provided sides out of peripheral edges of the pixels, and are connected to the 3-continuous-side-provided data lines, and wherein common lines that fix one electrode of the storage capacitors to a specific electric potential and extend in a substantially straight line shape between the plural data lines so as not to intersect with the data lines.

A sixteenth aspect of the present invention is a radiographic imaging apparatus that captures a radiographic image using a radiographic image detecting panel disposed with a radiation detecting element that includes a sensor section configured from plural hexagonal shaped pixels that each include a semiconductor film that receives irradiated radiation and generates charges arrayed adjacent to each other in a two dimensional pattern, wherein plural data lines are disposed so as to bend along a peripheral edge of the hexagonal shaped pixels, and switching elements that read charges accumulated in storage capacitors are placed within regions surrounded by a line segment that divides the pixels in two in a direction intersecting with the extension direction of the plural scan lines and 3 continuous data-line-provided sides out of peripheral edges of the pixels, and are connected to the 3-continuous-side-provided data lines, and wherein common lines fix one electrode of the storage capacitors to a specific electric potential and extend in a substantially straight line shape between the plural data lines so as not to intersect with the data lines.

The above aspect of the present invention may provide a radiation detecting element, a radiographic image detecting panel and a radiographic image detecting apparatus that are capable of achieving greater miniaturization whilst avoiding the interline pitch of signal lines becoming narrower

BRIEF DESCRIPTION OF DRAWINGS

Detailed explanation follows regarding exemplary embodiments of the present invention, with reference to the following drawings.

DETAILED DESCRIPTION OF THE INVENTION

Figure 1:
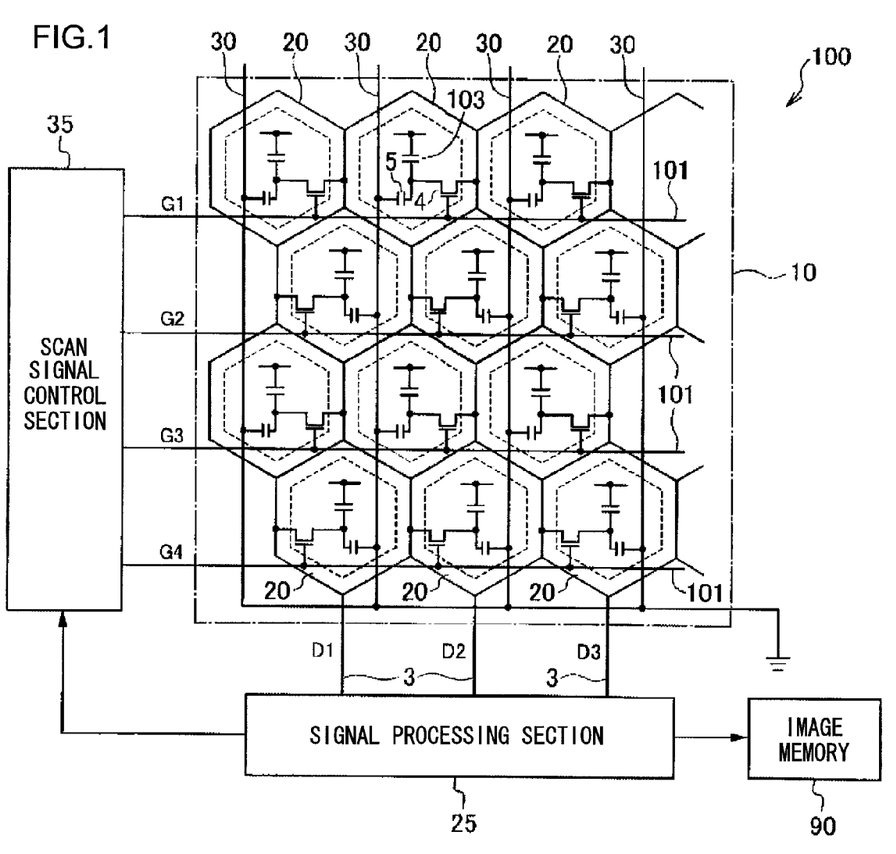
FIG. 1 is a diagram illustrating an overall configuration of a radiographic image detecting apparatus according to an exemplary embodiment of the present invention.
Figure 2:
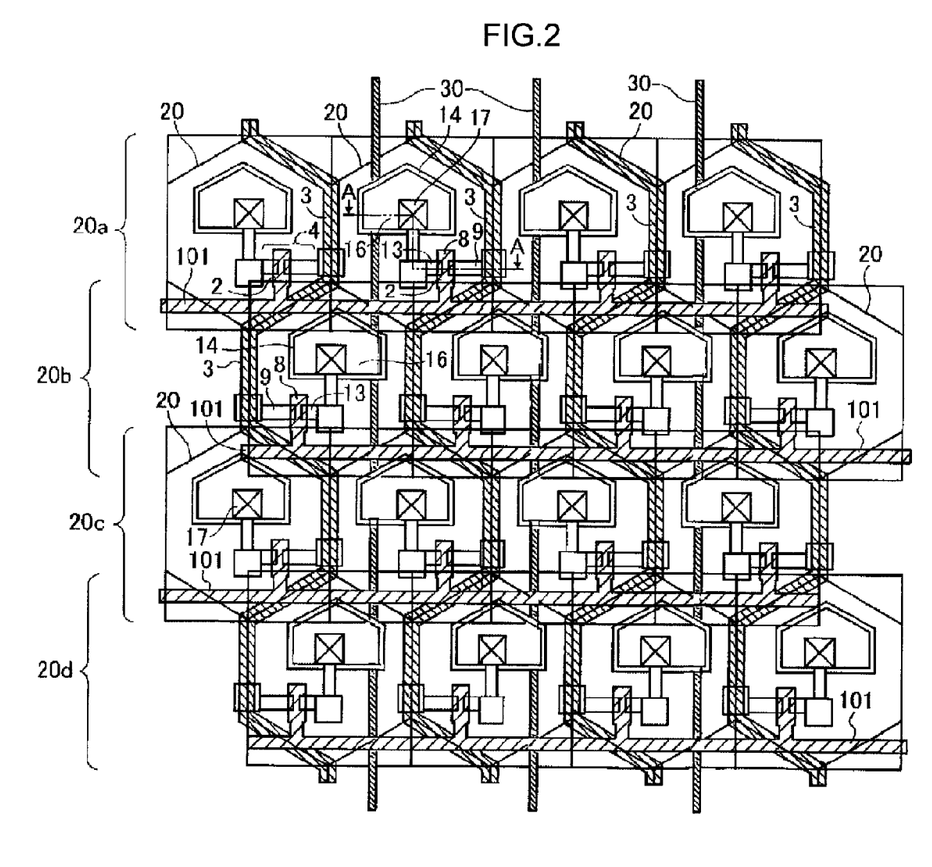
FIG. 2 is a plan view schematically illustrating a structure of pixel units in a radiation detecting element of a radiographic image detecting apparatus according to the present exemplary embodiment.
Figure 3:
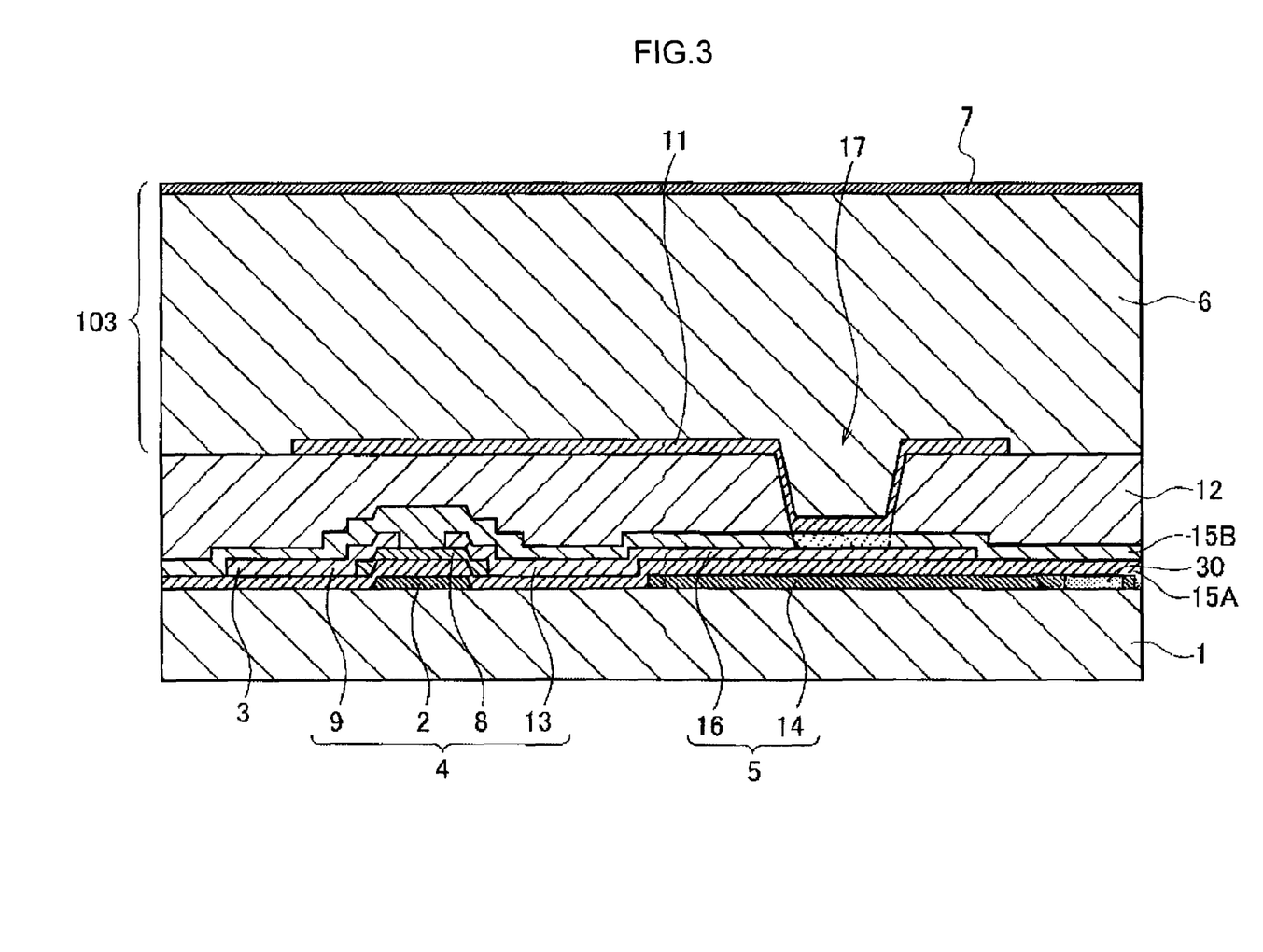
FIG. 3 is a cross-section taken along line A-A of FIG. 2.

Explanation next follows regarding an exemplary embodiment of the present invention, with reference to the drawings. FIG. 1 is illustrates an overall configuration of a radiographic image detecting apparatus according to an exemplary embodiment of the present invention. FIG. 2 illustrates a plan view schematically illustrating a structure of pixel units for a radiation detecting element 10 of a radiographic image detecting apparatus 100 according to an exemplary embodiment. FIG. 3 is a cross-section taken along line A-A of FIG. 2.

A radiation detecting element 10 of the radiographic image detecting apparatus 100 illustrated in FIG. 1 is configured with plural hexagonal shaped pixels 20, with many of the pixels 20 arrayed adjacent to each other in a two dimensional pattern, such that the honeycomb pattern arrayed pixels 20 configure a pixel region. Each of the pixels 20 is configured including a sensor section 103, a charge storage capacitor 5, and a thin film transistor 4 (also referred to as a TFT switch). In each of the pixels 20, the sensor section 103 (see FIG. 3) receives radiation (X-rays) that has been irradiated, and generates charges. The charge storage capacitor 5 accumulates the charges that have been generated in the sensor section 103. The thin film transistor 4 reads the charges accumulated in the charge storage capacitor 5.

Note that the "hexagonal shape" for the pixel shape is not limited to a regular hexagonal shape, and includes substantially hexagonal shapes with the corners beveled. Moreover it also includes, for example, a substantially hexagonal shape as viewed in plan view, such as a flattened hexagonal shape that is squashed in the page top-bottom direction of FIG. 1. Moreover, placing each of the pixels 20 in a honeycomb pattern refers to arraying first pixel rows and second pixel rows alternately to each other along a direction intersecting with a specific direction, as illustrated in pixel rows 20a to 20d illustrated in FIG. 2 and FIG. 4, such that the pixels 20 of the second pixel rows are disposed so as to correspond to positions between the pixels of adjacent first pixel rows, so as to be disposed displaced by ½ the array pitch relative to the pixels 20 of the first pixel row. Plural same sized hexagonal shaped pixels 20 are arrayed along the specific direction in the first pixel rows. Plural hexagonal shaped pixels 20 of the same size as the pixels 20 of the first pixel rows are arrayed along the specific direction in the second pixel rows.

Note that in the present exemplary embodiment, the pixels 20 refer to substantially hexagonal shaped regions formed by data lines 3, described later, as illustrated in FIG. 1 and FIG. 2. It is sufficient to dispose the pixels 20 in a honeycomb pattern, and there is no limitation to the shape of the pixels 20 being substantially hexagonal shapes.

In the radiation detecting element 10 of the radiographic image detecting apparatus 100, plural scan lines 101 extend in a fixed direction (the across direction in FIG. 1), and plural data lines 3 are provided so as to extend in the vertical direction. The scan lines 101 are signal paths for switching the TFT switches 4 of each of the pixels ON/OFF. The data lines 3 signal paths for reading charges that have accumulated in the charge storage capacitors 5. Common ground lines 30 (also referred to as storage capacitor lines, or common lines) are provided extending in the vertical direction and connected to one electrode of each of the charge storage capacitors 5. Note that, in the radiation detecting element 10 illustrated in FIG. 1, for explanation and illustration, an example is illustrated of a configuration in which there are 4 lines of scan lines G1 to G4, 3 lines of data lines D1 to D3, and 4 lines of the common ground lines 30. Moreover, the radiation detecting element 10 adopts a configuration that employs a radiation-to-charge conversion material, such as amorphous selenium or the like, to directly convert radiation to charges.

In the radiation detecting element 10 of the radiographic image detecting apparatus 100, the scan lines G1 to G4 and the common ground lines 30 are each disposed with straight line shapes so as to be orthogonal to each other. The data lines D1 to D3 are disposed in a zigzag shape (or so as to snake) along the peripheral edges of the hexagonal shaped pixels 20. Note that, as described later, a photoelectric conversion layer 6 is provided so as to cover the charge storage capacitors 5 and the TFT switches 4. The photoelectric conversion layer 6 employs, for example, a semiconductor layer.

A signal processing section 25 includes signal detectors (not illustrated in the drawings) that detect charges flowing out of each of the data lines D1 to D3 as electrical signals, and subjects the detected electrical signals to specific processing. As well as this, the signal processing section 25 also respectively outputs a control signal representing a signal detecting timing and a control signal representing a scan signal output timing to each of the signal detectors and to a scan signal control section 35. As a result, the scan signal control section 35 receives the control signal from the signal processing section 25, and outputs a signal for switching the TFT switches 4 ON/OFF to the scan lines G1 to G4.

More specifically, in the signal processing section 25, charge signals being transmitted by the individual data lines D1 to D3 are amplified by amplifiers (not illustrated in the drawings) and held in sample-and-hold circuits (not illustrated in the drawings). The charge signals held in the individual sample-and-hold circuits are input in sequence to a multiplexer (not illustrated in the drawings), and then converted into digital image data by an A/D converter (not illustrated in the drawings). Moreover, as illustrated in FIG. 1, an image memory 90 is connected to the signal processing section 25. The digital image data output from the A/D converter is stored in sequences in the image memory 90. The image memory 90 stores, for example, the captured radiographic image as plural frames worth of digital image data.

In cases in which radiographic images are captured by the radiographic image detecting apparatus 100 using the radiation detecting element 10 as described above, while the radiation (X-rays) is being irradiated, an OFF signal is output to each of the scan lines G1 to G4, and each of the TFT switches 4 is switched OFF, such that charges generated in a semiconductor layer, described later, are accumulated in each of the charge storage capacitors 5. Then, in order to read images, an ON signal is output one line at a time to each of the scan lines G1 to G4, each of the TFT switches 4 is switched ON, and charges accumulated in the charge storage capacitors 5 are read as electrical signals, so as to obtain a radiographic image by converting the read electrical signals into digital data.

FIG. 2 is a plan view schematically illustrating a structure of pixel units for a radiation detecting element 10. As illustrated in FIG. 2, in the radiation detecting element 10, plural scan lines 101 are disposed parallel to each other in the across direction (row direction), and plural data lines 3 are disposed so as to intersect with the scan lines 101, and so as to extend vertically (the column direction) whilst bending along the peripheral edges of the pixels 20. In the radiation detecting element 10, the plural common ground lines 30 are disposed so as to be orthogonal to the plural scan lines 101, and so as to be disposed between the plural data lines 3 whilst not intersecting with the plural data lines 3.

In the radiation detecting element 10, as illustrated in FIG. 3 that is a cross-section taken along A-A of FIG. 2, the gate electrodes 2, the scan lines 101 and the storage capacitor lower electrodes 14 are formed as a gate wiring layer on an insulating substrate 1. The common ground lines 30 are, for example as illustrated in FIG. 3, formed on the insulating substrate 1 by the same metal layer as the storage capacitor lower electrodes 14.

The scan lines 101, as illustrated in FIG. 2, are disposed one-for-one with the pixel rows 20a to 20d configured from the respective plural pixels, and are connected to gate electrodes 2 formed to each of the pixels 20. The gate wiring layer for the gate electrodes 2 is, for example, formed of Al or Cu, or formed using stacked layers formed mainly from Al or Cu.

An insulating film 15A is formed on one face above the gate wiring layer, and the locations of the insulating film 15A above the gate electrodes 2 act as gate insulation films for the TFT switches 4. The insulating film 15A is, for example, configured from SiNx, and is formed, for example, by a Chemical Vapor Deposition (CVD) film forming process. Semiconductor active layers 8 are formed with island shapes on the insulation film 15A above each of the gate electrodes 2. The semiconductor active layers 8 are channel portions of the TFT switches 4 and are, for example, formed from an amorphous silicon film.

The source electrodes 9 and the drain electrodes 13 are formed in a layer above the gate electrodes 2. In the wiring layer in which the source electrodes 9 and the drain electrodes 13 are formed, the data lines 3 are also formed together with the source electrodes 9 and the drain electrodes 13. Storage capacitor upper electrodes 16 are also formed at positions on the insulating film 15A corresponding to the storage capacitor lower electrodes 14. The drain electrodes 13 are connected to the storage capacitor upper electrodes 16. The data lines 3 are laid out so as to run along the peripheral edges of the pixels 20, bending so as to circumnavigate between one pixel and an adjacent pixel. The data lines 3 are connected to the source electrodes 9 formed to the pixels 20 in each of the pixel rows. Namely, the data lines 3 extend in the column direction along 3 connected sides out of the peripheral edges (6 sides) of the individual pixels 20.

Figure 4:
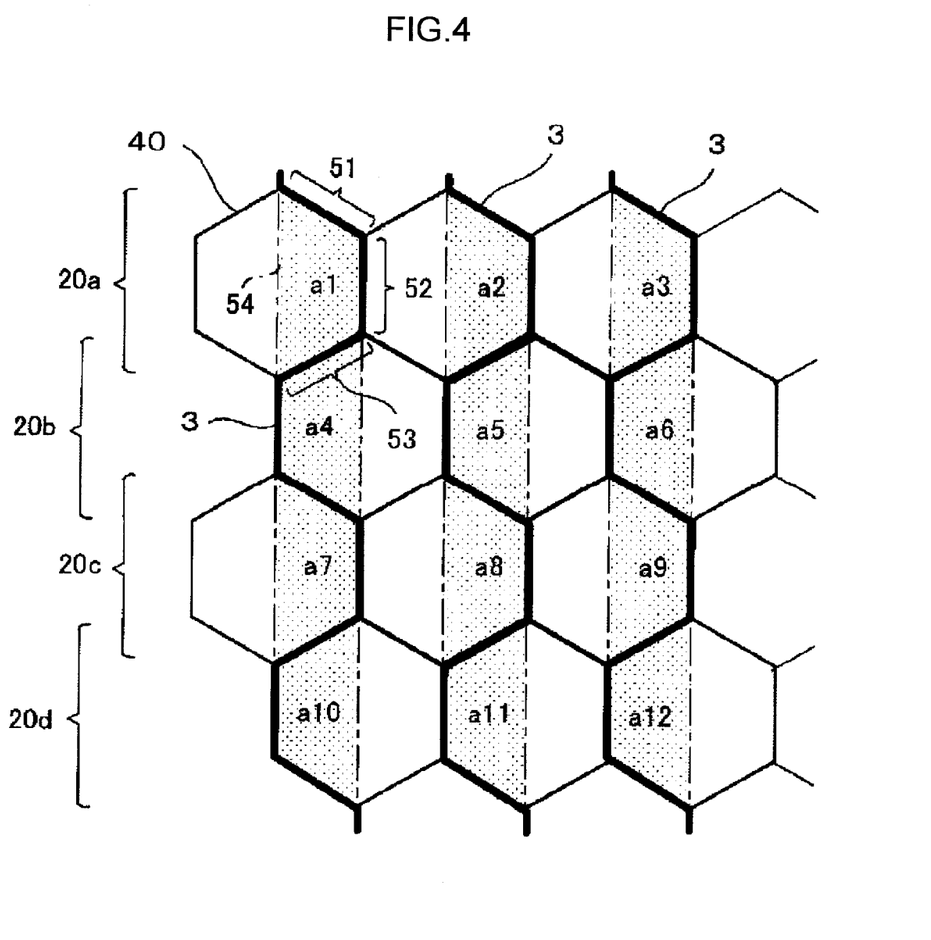
FIG. 4 is a plan view schematically illustrating placement positions of TFT switches in each of the pixels.

In the radiation detecting element 10 of the radiographic image detecting apparatus 100, the TFT switches 4 in each of the pixels 20 are configured differently every pixel row 20a to 20d. More specifically, as illustrated in FIG. 4, for each of the pixels of the pixel rows 20a to 20d, the TFT switches 4 are disposed in a region surrounded by a line dividing each of the pixels in the vertical direction (illustrated by intermittent lines in the drawings), and the 3 connected sides out of the peripheral edges of each of the pixels where the data lines 3 are continuously provided (taking an example of pixel 40, then in a regional surrounded by the line segment 54 and 3 sides, the sides 51 to 53). Namely, for the pixels of the pixel rows 20a, the TFT switches 4 are disposed in the regions a1 to a3, for the pixels of the pixel rows 20b disposed below the pixel rows 20a, the TFT switches 4 are disposed in the regions a4 to a6. Similarly thereon, the TFT switches 4 are respectively disposed in the regions a7 to a9 in the pixel rows 20c, and in the regions a10 to a12 in the pixel rows 20d.

Due to disposing the TFT switches 4 in this manner, for the pixels 20 positioned in the pixel rows 20a, the source electrodes 9 of the TFT switches 4 disposed in the regions a1 to a3 are connected to the 3-continuous-side-provided data lines 3 on the right hand side of the regions a1 to a3. In the pixels 20 of the pixel rows 20b, the source electrodes 9 of the TFT switches 4 disposed in the regions a4 to a6 are connected to the 3-continuous-side-provided data lines 3 on the left hand side of the regions a4 to a6. Similarly, in the pixel rows 20c and the pixel rows 20d, the source electrodes 9 of the TFT switches 4 are connected to the 3-continuous-side-provided data lines 3 on the right hand side of the regions a7 to a9 in the pixel rows 20c and the 3-continuous-side-provided data lines 3 on the left hand side of the regions a10 to a12 of the pixel rows 20d.

As a result, in the radiation detecting element 10, there is no longer a need to dispose the common ground lines 30 so as to bend to circumnavigate the connection points between the TFT switches 4 and the data lines 3. Accordingly, as illustrated in FIG. 2, in the radiation detecting element 10, it is possible to layout the common ground lines 30 in straight line shapes along the vertical direction (the column direction), enabling raising of the resistance of the common ground lines more than necessary to be avoided. Moreover, disposing the common ground lines 30 in straight line shapes enables the storage capacitor lower electrodes 14 to be connected together by a shorter distance. Consequently, efficiently reducing the connection resistance of the common ground lines 30 and the line resistance enables the ground lines and the storage capacitor lower electrodes 14 to be maintained at a stable constant voltage (for example ground voltage). Note that disposing the common ground lines 30 in a straight line shape means that a straight line state is maintained within a range permitted by tolerances in the manufacturing processes of the radiation detecting element 10.

The wiring layer (also referred to as the source wiring layer) formed with the source electrodes 9, the drain electrodes 13, the data lines 3 and the storage capacitor upper electrodes 16 illustrated in FIG. 3 is, for example, formed of Al or Cu, or using stacked layers formed mainly from Al or Cu. An impurity doped semiconductor layer (not illustrated in the drawings), such as impurity doped amorphous silicon is formed between the source electrodes 9 and the drain electrodes 13, and the semiconductor active layers 8. Note that, in the TFT switches 4, the source electrodes 9 and the drain electrodes 13 reverse depending on the charges collected and accumulated by the lower electrodes 11, described later.

A TFT protection-film layer 15B is formed so as to cover the source wiring layer over substantially the whole surface (substantially all regions) of the region where the pixels are provided on the substrate 1. The TFT protection-film layer 15B is formed, for example, from a material such as $SiN_x$ by, for example, a CVD film forming method. A coated interlayer insulating film 12 is then formed on the TFT protection-film layer 15B. The interlayer insulating film 12 is formed from a low permittivity (specific permittivity $\epsilon_r$=2 to 4) photosensitive organic material (examples of such materials include positive working photosensitive acrylic resin materials with a base polymer formed by copolymerizing methacrylic acid and glycidyl methacrylate, mixed with a naphthoquinone diazide positive working photosensitive agent) at a film thickness of 1 μm to 4 μm.

In the radiation detecting element 10 of the radiographic image detecting apparatus 100 according to the present exemplary embodiment, inter-metal capacitance between metal disposed in the layers above the interlayer insulating film 12 and below the interlayer insulating film 12 is suppressed to a small capacitance by the interlayer insulating film 12. Generally the materials referred to above forming the interlayer insulating film 12 also function as a flattening film, exhibiting an effect of flattening out steps in the layers below. In the radiation detecting element 10 of the radiographic image detecting apparatus 100, contact holes 17 are formed in the interlayer insulating film 12 and the TFT protection-film layer 15B at locations corresponding to the storage capacitor upper electrodes 16.

As illustrated in FIG. 3, lower electrodes 11 of the sensor portions 103 are formed on the interlayer insulating film 12 for each of the pixels 20 so as to cover the pixel region while also filling each of the contact holes 17. The lower electrodes 11 are formed from an amorphous transparent conducting oxide film (ITO) and are connected to the storage capacitor upper electrodes 16 through the contact holes 17. As a result, the lower electrodes 11 and the TFT switches 4 are electrically connected through the storage capacitor upper electrodes 16.

As illustrated by the intermittent lines in FIG. 1, the lower electrodes 11 are formed to match the pixels 20, in hexagonal shape, regular hexagonal shapes, of substantially hexagonal shapes with the corners beveled. However, similarly to with the pixels 20, there is no limitation to the shape of the profile of the lower electrodes 11 as long as the lower electrodes 11 are disposed in a honeycomb pattern similarly to the pixels 20.

The lower electrodes 11 and the data lines 3 may be disposed so as not to overlap with each other in the cross-sectional direction (the stacking direction in which each layer of the lower portion is stacked on the substrate 1). Disposing in such a manner enables the additional capacitance between the lower electrodes 11 and the data lines 3 to be reduced, and enables S/N of the signal flowing in the data lines 3 to be raised.

A photoelectric conversion layer 6 is uniformly formed on the lower electrodes 11 over substantially the entire surface of the pixel region where the pixels 20 are provided on the substrate 1. The photoelectric conversion layer 6 generates charges (electrons-holes) internally on irradiation with radiation such as X-rays. In other words, the photoelectric conversion layer 6 has electrical conduction properties and is employed to convert image data by radiation into charge data. For example, the photoelectric conversion layer 6 may be formed from a 100 μm to 1000 μm thickness film of amorphous selenium (a-Se) having selenium as the main component. Note that reference to the main component means contained at a ratio of 50% or more. An upper electrode 7 is formed on the photoelectric conversion layer 6. The upper electrode 7 is connected to a bias power source (not illustrated in the drawings) and supplies a bias voltage (for example several kV) from the bias power source. The plural scan lines 101, the plural data lines 3, the plural common ground lines 30 and the TFT switches 4 are disposed on the lower layer side of the sensor section 103 configured from the photoelectric conversion layer 6.

Explanation next follows regarding operation of the radiographic image detecting apparatus 100 according to the present exemplary embodiment. Charges (electron-hole pairs) are generated in the photoelectric conversion layer 6 when X-rays are irradiated onto the photoelectric conversion layer 6 in a state in which a bias voltage is being applied across the upper electrode 7 and the storage capacitor lower electrodes 14. The photoelectric conversion layer 6 and the charge storage capacitors 5 are in a structure electrically connected in series, and so electrons generated in the photoelectric conversion layer 6 migrate to the + (plus) electrode side and holes migrate to the − (minus) electrode side. During image detecting, OFF signals (0V) are output from the scan signal controller 35 to all the scan lines 101, applying a negative bias to the gate electrodes 2 of the TFT switches 4. Each of the TFT switches 4 are thereby maintained in an OFF state. As a result, electrons generated in the photoelectric conversion layer 6 are collected by the lower electrodes 11, and accumulated in the charge storage capacitors 5. The photoelectric conversion layer 6 generates a charge amount according to the amount of radiation irradiated, and so charges according to image data carried by the radiation are accumulated in the charge storage capacitors 5 of each of the pixels. Note that the charge storage capacitors 5 need to be given a large capacitance relative to the capacitance formed by the photoelectric conversion layer 6 in view of the voltage of several kV referred to above applied across the upper electrode 7 and the storage capacitor lower electrodes 14.

During image reading, ON signals are output from the scan signal control section 35 in sequence one line at a time to each of the scan lines 101, and the ON signals (for example signals with a voltage of +10 to 20V) are applied through the scan lines 101 to the gate electrodes 2 of the TFT switches 4. The TFT switches 4 of each of the pixels 20 of each of the pixel rows in the scan line direction are thereby switched ON one line at a time, and electrical signals according to the charge amount accumulated in the charge storage capacitors 5 of each of the pixels 20 flow out one line at a time through the data lines 3. The signal processing section 25 detects as data of pixels configuring an image a charge amount accumulated in the charge storage capacitors 5 based on the respective electrical signals flowing in each of the data lines 3. The radiation detecting element 10 is accordingly able to obtain image data expressing an image representing irradiated radiation.

As explained above, in the radiographic image detecting apparatus according to the present exemplary embodiment, the shape of the pixels configuring the radiation detecting element is a hexagonal shape, and many of these pixels are arrayed in a two-dimensional honeycomb pattern, with the position of the TFT switches in each of the pixels disposed so as to be left-right direction different for each of the pixel rows. Namely, the radiographic image detecting apparatus according to the present exemplary embodiment is configured such that the TFT switches are disposed within regions surrounded by a line segment dividing each of the pixels in two in the vertical direction and the 3 continuous data-line-3-provided sides out of the peripheral edges of each of the pixels, and the common ground lines are disposed in substantially straight line shapes further to the lower side than the pixel electrodes. Accordingly, the radiographic image detecting apparatus according to the present exemplary embodiment, in a direct-conversion-type radiographic image detecting apparatus, the storage capacitor lower electrodes of the charge storage capacitors of each of the pixels can be connected by using the shortest common ground lines.

Moreover, in the radiographic image detecting apparatus according to the present exemplary embodiment, the TFT switches are disposed in regions surrounded by line segments that divide each of the pixels into 2 vertically and by the 3 continuous data-line-3-provided sides out of the 6 sides of the pixels, and are alternately disposed so as to be on different left-right direction sides with respect to a central line of the pixels every pixel rows. Consequently, the situation with conventional placement positions of TFT switches in which the distance between the TFT switches and the data lines becomes narrow does not arise. Moreover, there is no need for common ground lines to snake around to match data lines in the radiographic image detecting apparatus according to the present exemplary embodiment, and the data lines and the common ground lines do not intersect with each other. Consequently, in the radiographic image detecting apparatus according to the present exemplary embodiment, increase in noise arising for example by being induced in data lines is suppressed, and an increase in the capacitance between the data lines and the common ground lines may be suppressed.

Moreover, in the radiographic image detecting apparatus according to the present exemplary embodiment, in the manufacturing processes of the radiation detecting element, a drop in manufacturing yield of radiation detecting elements due to the interline pitch of the data lines and the common ground lines becoming narrower may be prevented.

Figure 5A:
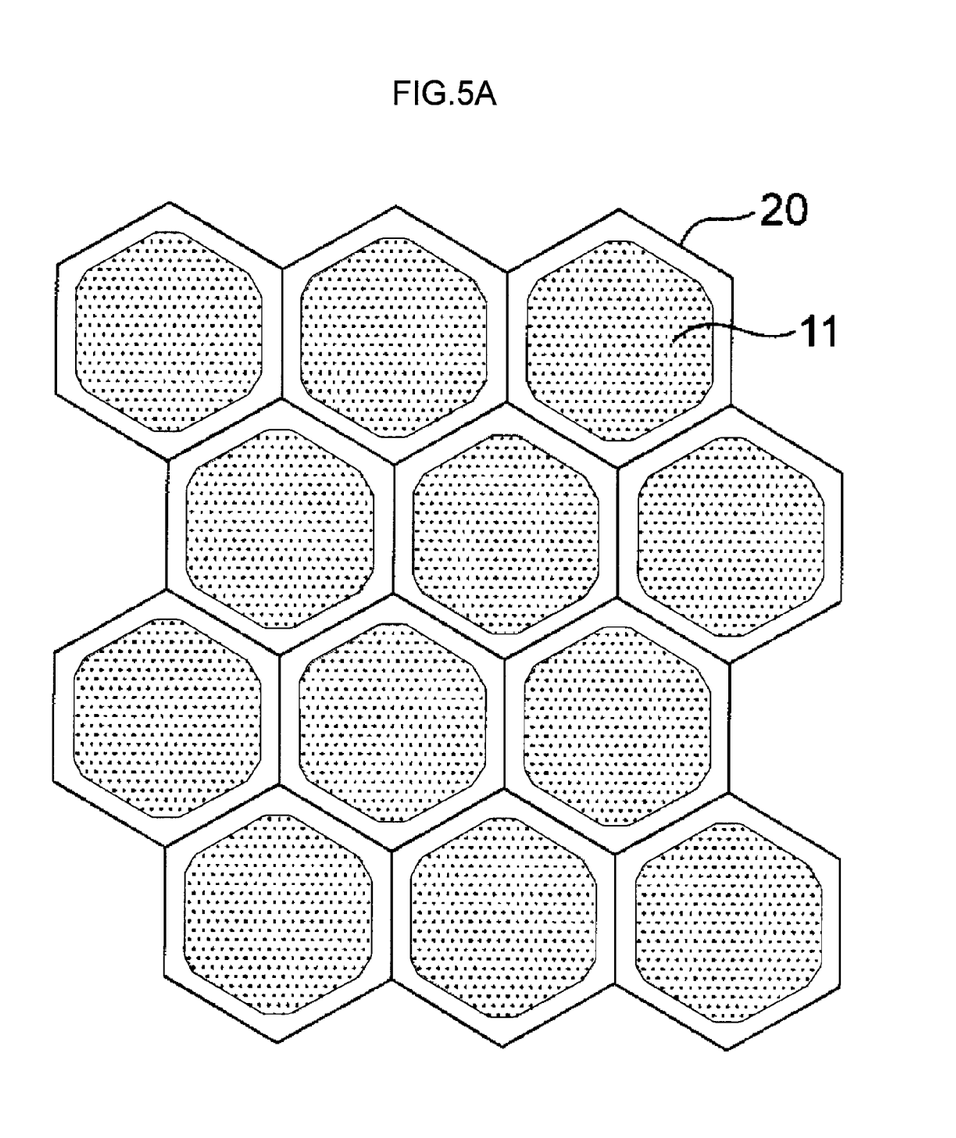
FIG. 5A is a plan view schematically illustrating a structure of pixels in a modified example of a radiation detecting element of the present exemplary embodiment.
Figure 5B:
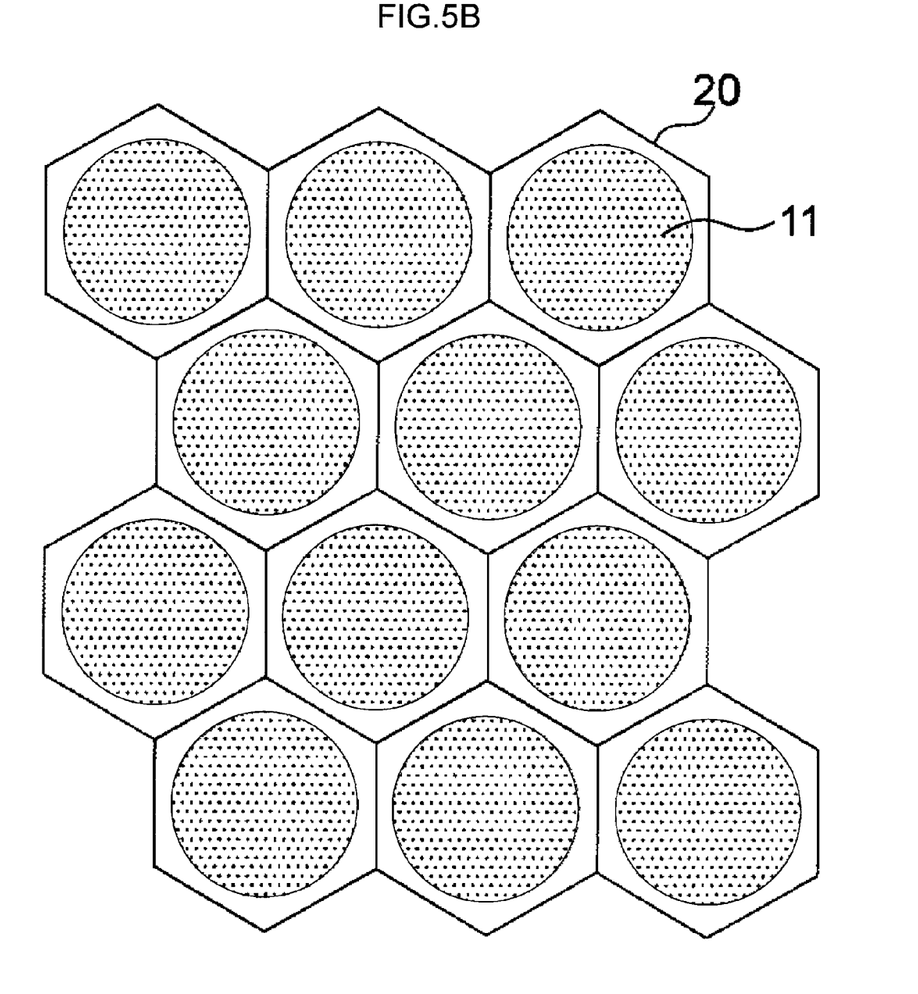
FIG. 5B is a plan view schematically illustrating a structure of pixels in a modified example of a radiation detecting element of the present exemplary embodiment.

Note that in the above exemplary embodiment, explanation has been given of cases in which, to match the shape of the pixels 20, the lower electrodes 11 are shaped in hexagonal shapes, regular hexagonal shapes, or substantially hexagonal shapes with the corners beveled. However, the present invention is not limited thereto. For example, as a modified example of the radiation detecting element 10 according to the above exemplary embodiment, as illustrated in FIG. 5A and FIG. 5B, the shape of the lower electrodes 11 may be formed, different to the shape of the pixels 20, as a substantially hexagonal shape with corners removed, or as a substantially hexagonal shape with rounded corners (and in certain cases by a circular shape).

In cases in which plural substantially hexagonal shaped pixels 20 are arrayed in a honeycomb pattern to configure a pixel region, the image data output from the radiation detecting element 10 of the above exemplary embodiment is image data that expresses an image with each of the pixels arrayed in a honeycomb pattern. However, generally most output devices such as printers and monitors are configured to handle images in which each of the pixels is arrayed in a square grid pattern. There is accordingly a need in the present exemplary embodiment to perform processing (pixel density conversion) in the signal processing section 25 to convert image data output from the radiation detecting element 10 into image data expressing an image in which plural substantially rectangular shape pixels are arrayed in a square grid pattern. Note that the pixel density conversion processing may be performed externally to the radiographic image detecting apparatus 100.

However, in the pixel density conversion, when there are a lot of high frequency components present in the image data before conversion, then sometimes, artifacts such as shaggy or unevenness occur in image data after conversion. In order to suppress such artifacts, there has conventionally been a need to perform filter processing to remove the high frequency components during pixel density conversion from a honeycomb array to a square grid array.

However, in the radiation detecting element 10 of the present modified example, in cases in which the lower electrodes 11 are formed in a substantially hexagonal shape with beveled corners, or formed in a substantially hexagonal shape with rounded corners (and in certain cases a circular shape), the electrical field intensity applied to the region between the pixels 20 and the lower electrodes 11 is weaker, and the sensitivity to high frequency components falls in portions further away from the center of the pixels 20. Thus in the radiation detecting element 10 of the present modified example, reducing the input of high frequency component themselves enables artifacts due to high frequency components to be suppressed from occurring during pixel density conversion. Moreover, the radiation detecting element 10 according to the present modified example enables subsequent filter processing to be simplified due to suppressing certain high frequency components from radiation detecting. The radiation detecting element 10 of the present modified example is thereby able to prevent a drop in quality due to excessive filter processing, and able to prevent a drop in processing speed from occurring due to filter processing becoming more complicated. Moreover, in the radiation detecting element 10 of the present modified example, due to elimination of the corners of the lower electrodes 11, overlap between the corner portions of the lower electrodes 11 and other wiring (for example the data lines 3) in the cross-sectional direction (namely in the stacking direction of each of the stacked layers with the substrate 1 at the bottom) may be prevented. Thus, the radiation detecting element 10 of the present modified example enables additional capacitance due to overlap between the lower electrodes 11 and other wiring to be reduced.

Note that although in the above exemplary embodiment explanation has been given regarding a radiation detecting element of a radiographic image detecting apparatus, the application scope of the radiation detecting element is not limited thereto. For example, application of the radiation detecting element may be made to a radiographic image detecting panel (for example a FPD or the like, however there is no limitation thereto), and application is also possible to a radiographic image detecting apparatus (such as for example a mammography apparatus, an upright dimensional X-ray imaging apparatus, a prone X-ray imaging apparatus, a CT imaging apparatus, an electronic cassette or the like, though there is no limitation thereto) that employs a radiographic image detecting panel containing the radiation detecting element for image capture.

Moreover, in the above exemplary embodiment the common ground lines 30 are laid out on the substrate 1. However, the present invention is not limited thereto. For example, the common ground lines 30 may be laid out in any layer below the lower electrodes 11 that collect the charges generated in the photoelectric conversion layer 6. Adopting this approach enables a drop to be avoided in the irradiation efficiency of radiation irradiated onto the sensor section 103 due to the common ground lines 30.

Figure 6:
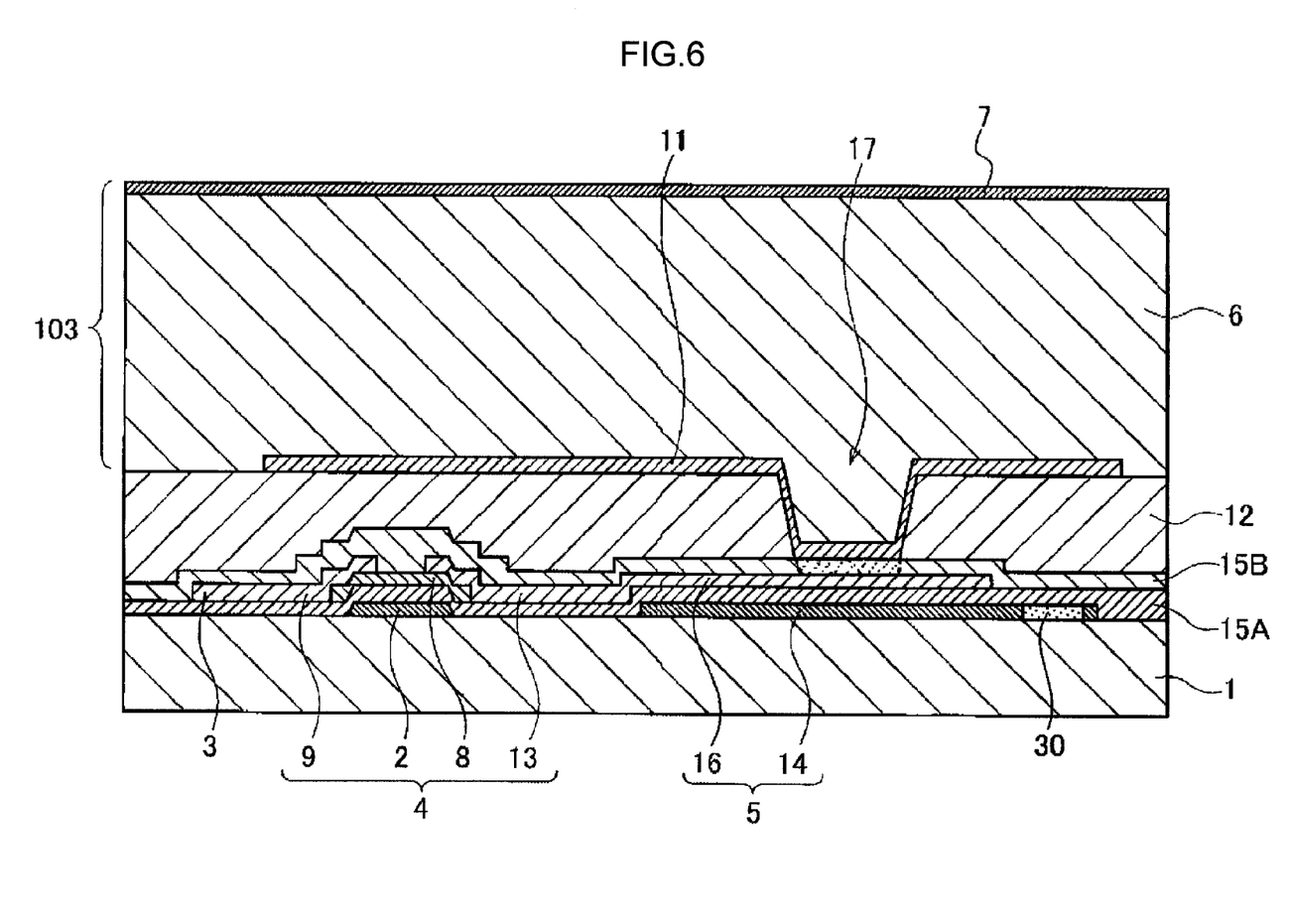
FIG. 6 is a cross-section of a structure of a pixel in a modified example of a radiation detecting element of the present exemplary embodiment.

Moreover, as illustrated in FIG. 6, the lower electrodes 11 and the common ground lines 30 may be disposed so as to overlap in the cross-sectional direction (namely in the stacking direction of each of the stacked layers with the substrate 1 at the bottom). In such an arrangement, since signals configuring image data different to the data lines 3 do not flow in the common ground lines 30, there is little influence imparted to the S/N of the image. However, in cases in which the above arrangement is adopted, the lower electrodes 11 may be made wider, and hence the charges generated by the photoelectric conversion layer 6 may be efficiently transported to the lower electrodes 11 when the electric field is generated between the upper electrode 7 and the lower electrodes 11 and the charges generated by the photoelectric conversion layer 6 are collected.

Moreover, as illustrated in FIG. 6, the lower electrodes 11 and the charge storage capacitors 5 (in particular the storage capacitor lower electrodes 14 and upper electrodes 16) may be disposed so as to overlap in the cross-sectional direction. The lower electrodes 11 can also be made wider in such cases in which this arrangement is adopted, and hence the charges generated by the photoelectric conversion layer 6 can be efficiently transported to the lower electrodes 11 when the electric field is generated between the upper electrode 7 and the lower electrodes 11 and the charges generated by the photoelectric conversion layer 6 are collected.

Moreover, in the present exemplary embodiment, there is no particular limitation to the radiation of the present invention, and application may be made to X-rays, alpha radiation and gamma radiation.

The disclosure of Japanese Patent Application No. 2011-177327 is incorporated by reference in its entirety in the present specification.

All cited documents, patent applications and technical standards mentioned in the present specification are incorporated by reference in the present specification to the same extent as if the individual cited document, patent application, or technical standard was specifically and individually indicated to be incorporated by reference.

What is claimed is:

1. A radiation detecting element comprising:
   a sensor section configured from a plurality of hexagonal shaped pixels, each of which includes a semiconductor film that receives irradiated radiation and generates charges, that are arrayed adjacent to each other in a two dimensional pattern;
   a detecting section, provided for each of the pixels, including a pixel electrode that collects the charges, a storage capacitor that accumulates charges that have been collected by the pixel electrode, and a switching element that reads the charges accumulated in the storage capacitor;

a plurality of scan lines that are disposed parallel to each other and that transmit signals for performing switching control of the switching elements;

a plurality of data lines that are disposed so as to intersect with the scan lines and so as to bend along a portion of a peripheral edge of the hexagonal shaped pixels, and that transmit electrical signals corresponding to the charges read by the switching elements; and a plurality of common lines that connect together one electrode of the storage capacitors and fix the storage capacitor electrodes at a specific potential, wherein the switching elements are placed within regions surrounded by a line segment that divides the pixels in two in a direction intersecting with the extension direction of the plurality of scan lines and 3 continuous data-line-provided sides out of peripheral edges of the pixels, and are connected to the 3-continuous-side-provided data lines, and the common lines are disposed between the plurality of data lines so as not to intersect with the data lines.

2. The radiation detecting element of claim 1, wherein the common lines extend in a straight line shape or a substantially straight line shape between the plurality of data lines.

3. The radiation detecting element of claim 1, wherein the plurality of common lines are connected to the plurality of data lines via the storage capacitors and the switching elements.

4. The radiation detecting element of claim 3, wherein the storage capacitors and the switching elements are placed alternately on one side or the other side of the data lines every pixel row delimited by the plurality of scan lines.

5. The radiation detecting element of claim 1, wherein the plurality of common lines are disposed at a lower layer side with respect to the pixel electrodes.

6. The radiation detecting element of claim 1, wherein the plurality of scan lines, the plurality of data lines, the plurality of common lines, and the switching elements are disposed at a lower layer side of the sensor section.

7. The radiation detecting element of claim 1, wherein the plurality of data lines are formed in a different metal layer from the metal layer in which the plurality of scan lines are formed, with an insulating film interposed therebetween.

8. The radiation detecting element of claim 1, wherein a gate electrode of the switching element is connected to the scan lines, one out of the drain electrode or the source electrode is connected to one electrode of the storage capacitor, and the other out of the drain electrode or the source electrode is connected to the data line.

9. The radiation detecting element of claim 1, wherein the pixel electrodes are disposed so as not to overlap in the cross-sectional direction with the data lines.

10. The radiation detecting element of claim 9, wherein the pixel electrodes are disposed so as to overlap in the cross-sectional direction with the common lines.

11. The radiation detecting element of claim 9, wherein the pixel electrodes are disposed so as to overlap in the cross-sectional direction with the storage capacitors.

12. The radiation detecting element of claim 1, wherein the shape of the pixel electrodes is substantially equivalent to the shape of the hexagonal shaped pixels, and is a substantially hexagonal shape having corners beveled and a surface area smaller than the surface area of the pixels.

13. The radiation detecting element of claim 1, wherein the shape of the pixel electrodes is a circular shape having a surface area smaller than the surface area of the pixels.

14. A radiographic image detecting apparatus comprising:
the radiation detecting element of claim 1;
a scan signal control section that outputs, to the plurality of scan lines, signals for performing switching control of the switching elements; and
a signal processing section that detects the electrical signals transmitted through the plurality of data lines, that subjects the detected electrical signals to specific processing, and that generates digital image data,
wherein the signal processing section converts image data obtained from the plurality of hexagonal shaped pixels into image data representing an image of a plurality of substantially square shaped pixels arrayed in a square grid, and generates the digital image data.

15. A radiographic image detecting panel disposed with a radiation detecting element that comprises a sensor section configured from a plurality of hexagonal shaped pixels that each include a semiconductor film that receives irradiated radiation and generates charges arrayed adjacent to each other in a two dimensional pattern,
wherein a plurality of data lines are disposed so as to bend along a peripheral edge of the hexagonal shaped pixels, and switching elements that read charges accumulated in storage capacitors are placed within regions surrounded by a line segment that divides the pixels in two in a direction intersecting with the extension direction of the plurality of scan lines and 3 continuous data-line-provided sides out of peripheral edges of the pixels, and are connected to the 3-continuous-side-provided data lines, and
wherein common lines that fix one electrode of the storage capacitors to a specific electric potential and extend in a substantially straight line shape between the plurality of data lines so as not to intersect with the data lines.

16. A radiographic imaging apparatus that captures a radiographic image using a radiographic image detecting panel disposed with a radiation detecting element that comprises a sensor section configured from a plurality of hexagonal shaped pixels that each include a semiconductor film that receives irradiated radiation and generates charges arrayed adjacent to each other in a two dimensional pattern,
wherein a plurality of data lines are disposed so as to bend along a peripheral edge of the hexagonal shaped pixels, and switching elements that read charges accumulated in storage capacitors are placed within regions surrounded by a line segment that divides the pixels in two in a direction intersecting with the extension direction of the plurality of scan lines and 3 continuous data-line-provided sides out of peripheral edges of the pixels, and are connected to the 3-continuous-side-provided data lines, and
wherein common lines fix one electrode of the storage capacitors to a specific electric potential and extend in a substantially straight line shape between the plurality of data lines so as not to intersect with the data lines.

* * * * *